(12) United States Patent
Cox et al.

(10) Patent No.: US 8,929,040 B2
(45) Date of Patent: Jan. 6, 2015

(54) ESD PROTECTION DEVICE FOR SST TRANSMITTER

(71) Applicant: International Business Machines Corporation, Armonk, NY (US)

(72) Inventors: Carrie E. Cox, Apex, NC (US); Robert J. Gauthier, Jr., Hinesburg, VT (US); Junjun Li, Williston, VT (US); Xingle Wang, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 13/755,668

(22) Filed: Jan. 31, 2013

(65) Prior Publication Data

US 2014/0211350 A1    Jul. 31, 2014

(51) Int. Cl.
    *H02H 9/00*     (2006.01)
    *H02H 9/04*     (2006.01)

(52) U.S. Cl.
    CPC .................................... *H02H 9/045* (2013.01)
    USPC .......................................................... 361/56

(58) Field of Classification Search
    CPC ...................................................... H02H 9/046
    USPC .......................................................... 361/56
    See application file for complete search history.

(56) References Cited

U.S. PATENT DOCUMENTS

| | | | |
|---|---|---|---|
| 6,717,220 B2 | 4/2004 | Cheng et al. |
| 6,762,918 B2 | 7/2004 | Voldman |
| 7,307,447 B2 | 12/2007 | Clements et al. |
| 8,010,927 B2 | 8/2011 | Gauthier, Jr. et al. |
| 2008/0049365 A1 | 2/2008 | Worley et al. |
| 2008/0158747 A1 | 7/2008 | Voldman |
| 2009/0039916 A1 | 2/2009 | Buchmann et al. |
| 2010/0265622 A1 | 10/2010 | Campi, Jr. et al. |
| 2012/0091530 A1 | 4/2012 | Campi, Jr. et al. |

FOREIGN PATENT DOCUMENTS

| | | |
|---|---|---|
| EP | 694969 A3 | 4/1995 |
| JP | 3257866 B2 | 11/1991 |

OTHER PUBLICATIONS

Application No. PCT/US14/11761, Search Report, May 13, 2014, 9 pages.
Brennan, "ESD design automation & methodology to prevent CDM failures in 130 & 90 nm ASIC design systems" Jul. 1, 2005, 16 pages.

*Primary Examiner* — Rexford Barnie
*Assistant Examiner* — Tien Mai
(74) *Attorney, Agent, or Firm* — David A. Cain; Hoffman Warnick LLC

(57) ABSTRACT

Aspects of the invention provide for an ESD protection device for an SST transmitter. In one embodiment, the ESD protection device includes: a primary ESD protection structure at an output of the SST transmitter; and an additional protection ESD structure in parallel with a slice of the SST transmitter, the additional ESD protection structure including: a first device in parallel with a pull-up transistor network within the slice; and a second device in parallel with a pull-down transistor network within the slice.

16 Claims, 6 Drawing Sheets

ESD PROTECTION DEVICE FOR SST TRANSMITTER

FIELD OF THE INVENTION

The disclosure relates generally to electrostatic discharge (ESD) protection devices, and more particularly, to an ESD protection device for a source serial termination (SST) transmitter.

BACKGROUND

In integrated circuits, the decrease in technology scaling is causing the design window for ESD protection devices to correspondingly shrink. Smaller and thinner devices also lead to the metal resistances of wires used in the devices to increase, which leads to a higher voltage drop over the metal wirings, which makes it difficult to clamp voltages during ESD events. As devices get smaller and thinner, the threat of ESD increases; however, it becomes increasingly difficult to make effective ESD protection devices.

ESD protection is of particular concern for source serial termination (SST) transmitters, such as the SST transmitter 1 shown in the integrated circuit 100 of FIG. 1. SST transmitter 1 includes an ESD protection structure 5. The ESD protection structure 5 includes an ESD protection device 6 that provides protection between the power supply 12 ("POWER_PAD") and the output 11 ("IO_PAD"), an ESD protection device 7 that provides protection between the output 11 and ground ("GROUND_PAD"), and an ESD protection device 8 that provides protection from power supply 12 to ground. However, due to the size restrictions on ESD protection structure 5, ESD protection structure 5 may not be effective in clamping the voltage during an ESD event.

BRIEF SUMMARY

Aspects of the invention provide for an ESD protection device for an SST transmitter. In one embodiment, the ESD protection device includes: a primary ESD protection structure at an output of the SST transmitter; and an additional ESD protection structure in parallel with a slice of the SST transmitter, the additional ESD protection structure including: a first device in parallel with a pull-up transistor network within the slice; and a second device in parallel with a pull-down transistor network within the slice.

A first aspect of the disclosure provides an electrostatic discharge (ESD) protection device for a high-speed source serial termination (SST) transmitter, the ESD protection device comprising: a primary ESD protection structure at an output of the SST transmitter; and an additional ESD protection structure in parallel with a slice of the SST transmitter, the additional ESD protection structure including: a first device in parallel with a pull-up transistor network within the slice; and a second device in parallel with a pull-down transistor network within the slice.

A second aspect of the disclosure provides a design structure tangibly embodied in a machine readable medium for designing, manufacturing, or testing an integrated circuit, the design structure comprising an electrostatic discharge (ESD) protection device for a high-speed source serial termination (SST) transmitter, the ESD protection device comprising: a primary ESD protection structure at an output of the SST transmitter; and an additional ESD protection structure in parallel with a slice of the SST transmitter, the additional ESD protection structure including: a first device in parallel with a pull-up transistor network within the slice; and a second device in parallel with a pull-down transistor network within the slice.

BRIEF DESCRIPTION OF THE DRAWINGS

The above and other aspects, features and advantages of the disclosure will be better understood by reading the following more particular description of the disclosure in conjunction with the accompanying drawings.

Figure 1:
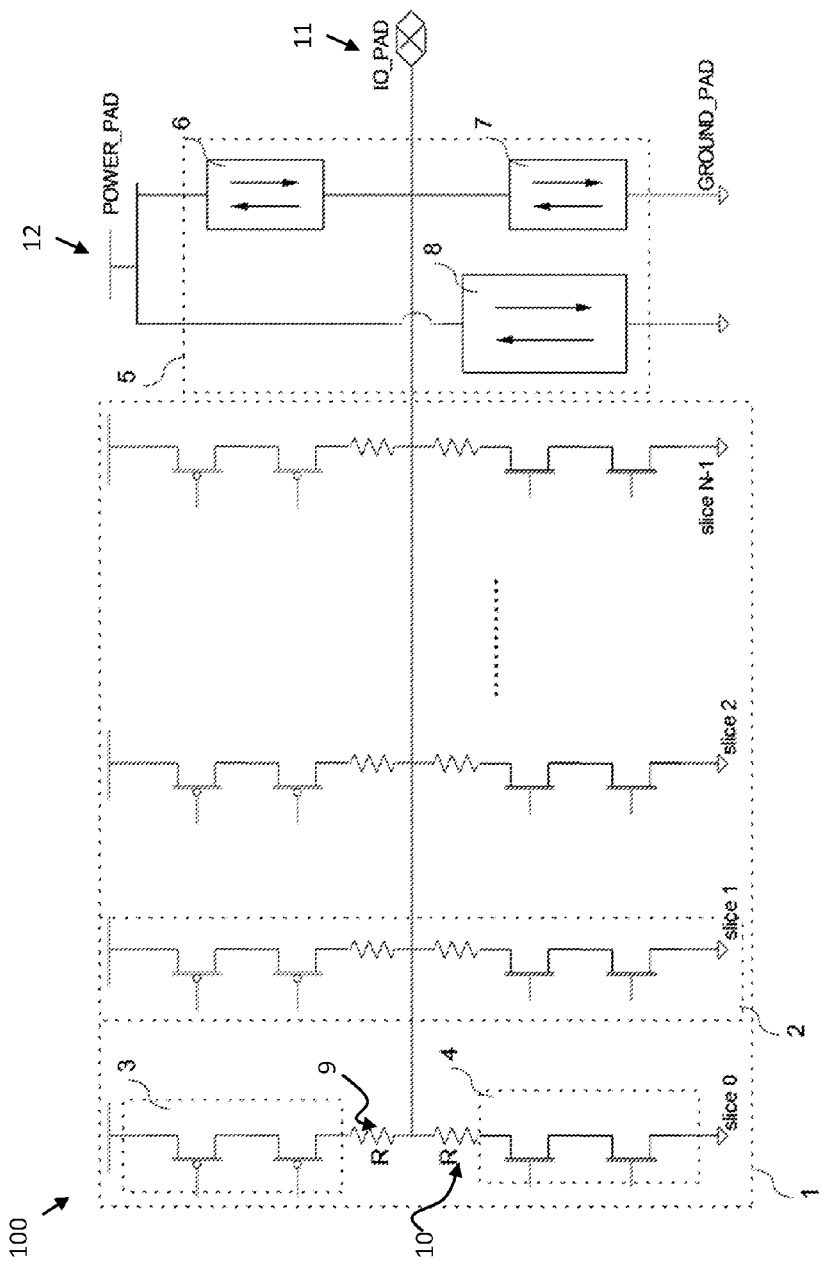
FIG. 1 shows a circuit diagram of an integrated circuit including a conventional SST transmitter with a conventional ESD protection structure.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

As mentioned above, the disclosure relates generally to electrostatic discharge (ESD) protection devices, and more particularly, to an ESD protection device for a source serial termination (SST) transmitter.

In integrated circuits, the decrease in technology scaling is causing the design window for ESD protection devices to correspondingly shrink. Smaller and thinner devices also lead to the metal resistances of wires used in the devices to increase, which leads to a higher voltage drop over the metal wirings, which makes it difficult to clamp voltages during ESD events. As devices get smaller and thinner, the threat of ESD increases; however, it becomes increasingly difficult to make effective ESD protection devices.

ESD protection is of particular concern for source serial termination (SST) transmitters, such as the SST transmitter 1 shown in the integrated circuit 100 of FIG. 1. SST transmitter 1 includes an ESD protection structure 5. The ESD protection structure 5 includes an ESD protection device 6 that provides protection between the power supply 12 ("POWER_PAD") and the output 11 ("IO_PAD"), an ESD protection device 7 that provides protection between the output 11 and ground, and an ESD protection device 8 that provides protection from power supply 12 to ground. The ESD protection devices 6, 7, 8 may include any known or later developed ESD protection device, such as but not limited to, diodes, silicon-controlled rectifiers, power clamps, and the like.

As seen in FIG. 1, the SST transmitter 1 includes a plurality of slices 2 (shown as "slice 0," "slice 1," "slice 2," . . . "slice N−1"). Each slice 2 includes a pull-up transistor network 3 and a pull-down transistor network 4. A first series terminator resistor 9 connects the pull-up transistor network 3 to the output 11, and a second series terminator resistor 10 connects the pull-down transistor network 4 to the output 11. During an ESD event, ESD protection structure 5 attempts to effectively clamp the voltage to protect the transistor networks 3, 4. However, due to the size restrictions on ESD protection structure 5, ESD protection structure 5 may not be effective in clamping the voltage during an ESD event.

Aspects of the invention provide for an ESD protection device for an SST transmitter. In one embodiment, the ESD protection device includes: a primary ESD structure at an output of the SST transmitter; and an additional ESD structure in parallel with a slice of the SST transmitter, the additional ESD structure including: a first ESD device in parallel with a pull-up transistor network within the slice; and a second ESD device in parallel with a pull-down transistor network within the slice.

Figure 2:
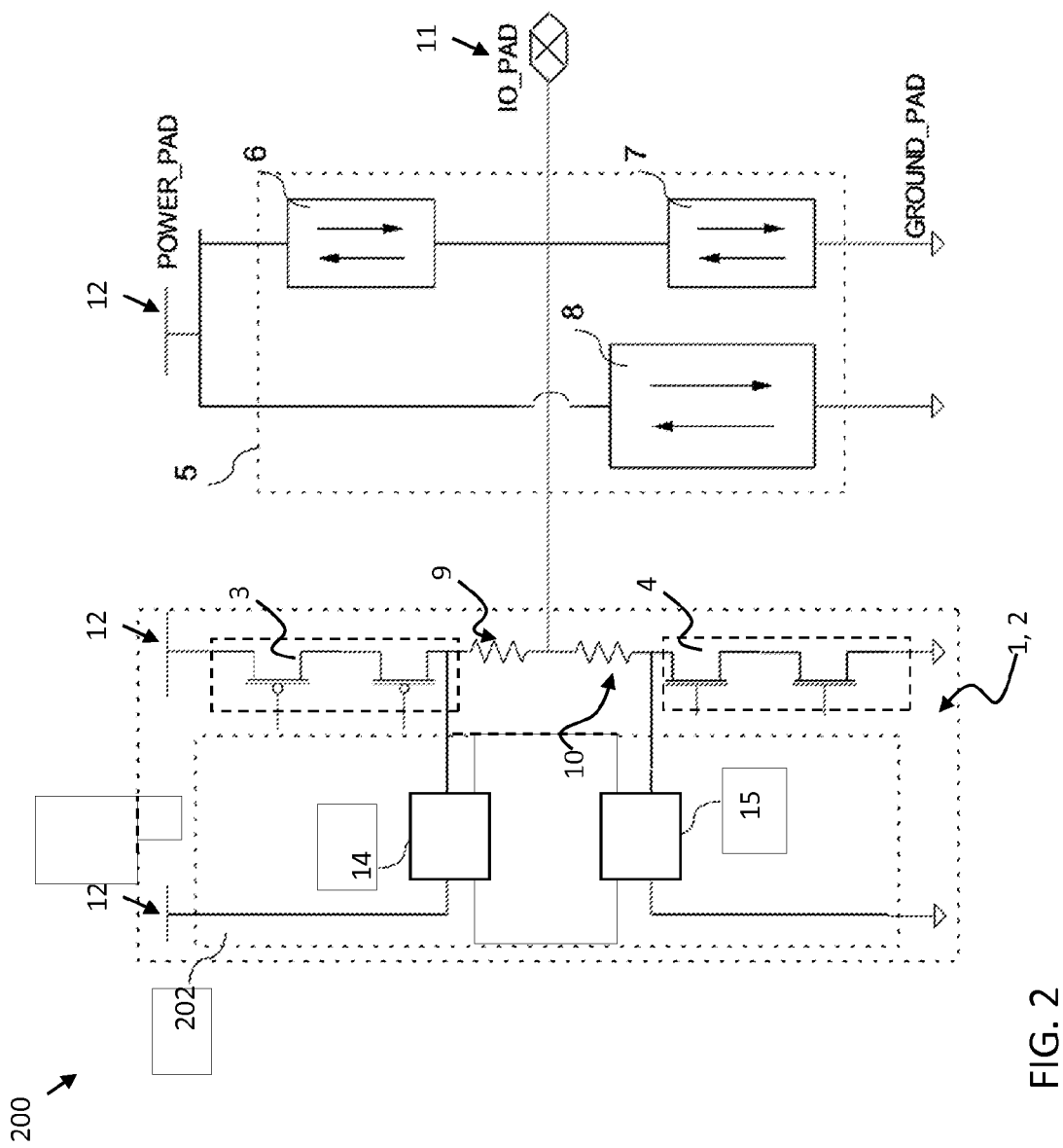
FIG. 2 shows a circuit diagram of an ESD protection device according to embodiments of the invention.

Turning now to FIG. 2, a circuit diagram of an ESD protection device 200 according to embodiments of the invention is shown. Although only one slice 2 of SST 1 is shown, it is understood that this is for exemplary purposes only, and that a plurality of slices 2, as shown in FIG. 1, may be present. The slices 2 include a pull-up transistor network 3, which includes a plurality of p-type field effect transistors (pFETS), while the pull-down transistor network 4 includes a plurality of n-type field effect transistors (nFETS). The ESD protection device 200 includes a primary ESD structure 5 at an output 11 of the SST transmitter 1, similar to the ESD structure 5 shown in FIG. 1.

The ESD protection device 200 also includes an additional ESD protection structure 202 in parallel with the slice 2 of the SST transmitter 1. Although not shown, it is understood that in the case that the SST transmitter 1 includes a plurality of slices 2, an additional ESD protection structure 202 may be provided in parallel with each of the slices 2. The additional ESD protection structure 202 includes a first device 14 connected in parallel with the pull-up transistor network 3 and a second device 15 connected in parallel with the pull-down transistor network 4. The first device 14 is connected to the power supply 12, while the second device 15 is connected to ground. A first series terminator resistor 9 connects the first device 14 and the pull-up transistor network 3 to the output 11. A second series terminator resistor 10 connects the second device 15 and the pull-down resistor network 4 to the output 11.

Figure 3:
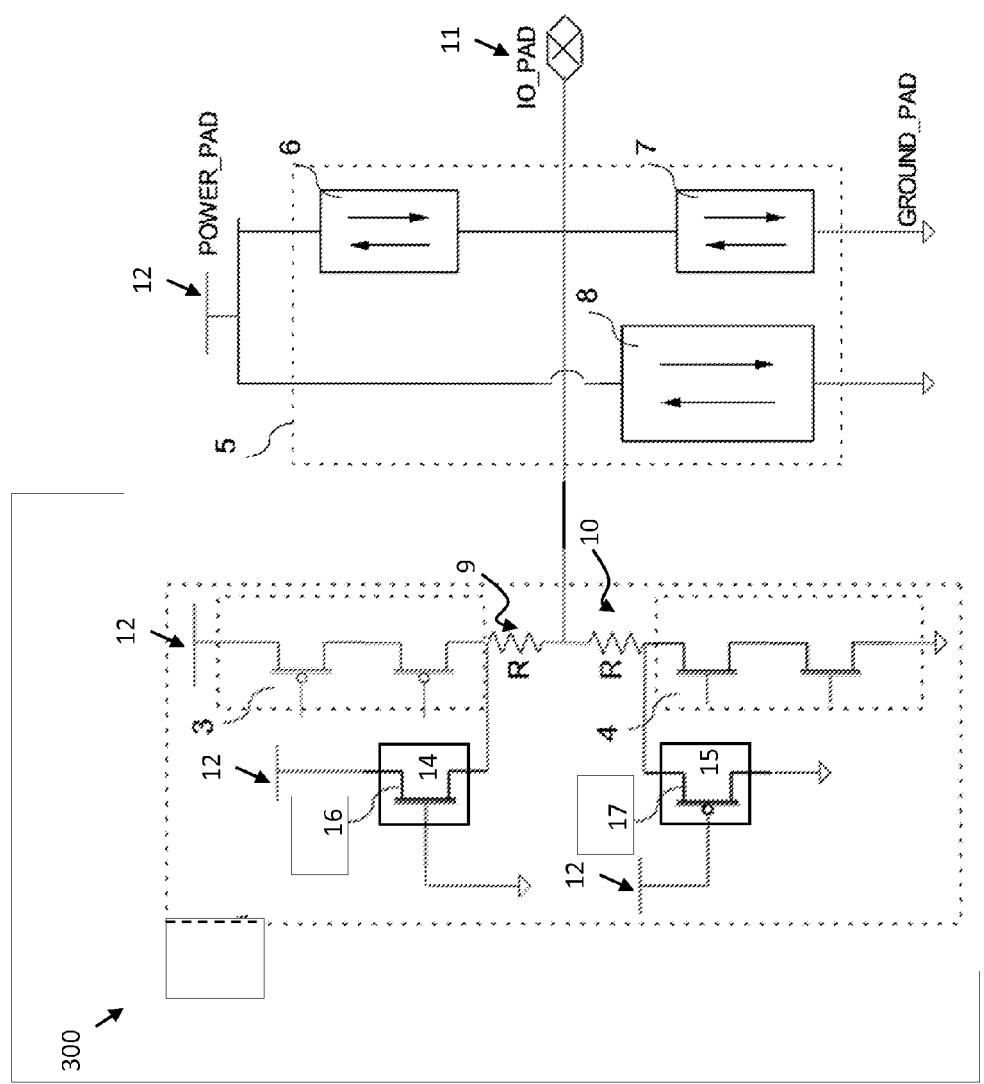
FIG. 3 shows a circuit diagram of an ESD protection device according to embodiments of the invention.

As seen in the circuit diagram in FIG. 3, an ESD protection device 300 may include an nFET as the first device 14. Further, the ESD protection device 300 may include a pFET as the second device 15. A gate of the nFET 16 is connected to ground, while a gate of the pFET 17 is connected to the power supply 12.

During normal operation, nFET 16 and pFET 17 remain in the off condition. However, during an ESD event, in addition to the primary ESD protection structure 5 clamping the voltage, nFET 16 or pFET 17 will trigger and turn on to effectively clamp the voltage. For example, if a positive voltage occurs at the output 11 during an ESD event, pFET 17 would turn on and leak current. This causes a voltage drop across the second series terminator resistor 10, so that the transistors in the pull-down transistor network 4 are protected from the positive voltage at the output 11. Alternatively, if a negative voltage occurs at the output 11 during an ESD event, nFET 16 would turn on and leak current. This, similarly, causes a voltage drop across the first series terminator resistor 9, so that the transistors in the pull-up transistor network 3 are protected from the negative voltage at the output 11.

Figure 4:
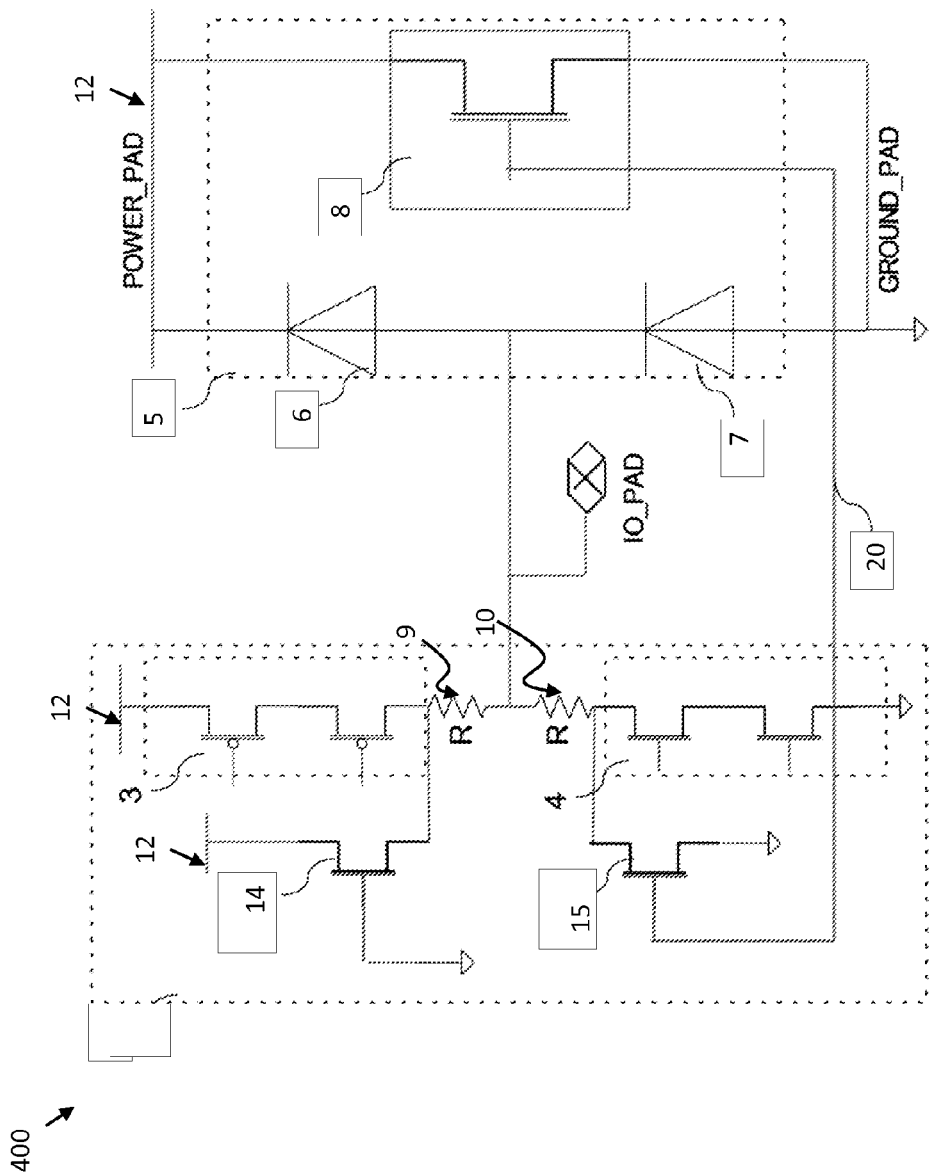
FIG. 4 shows a circuit diagram of an ESD protection device structure according to embodiments of the invention.
Figure 5:
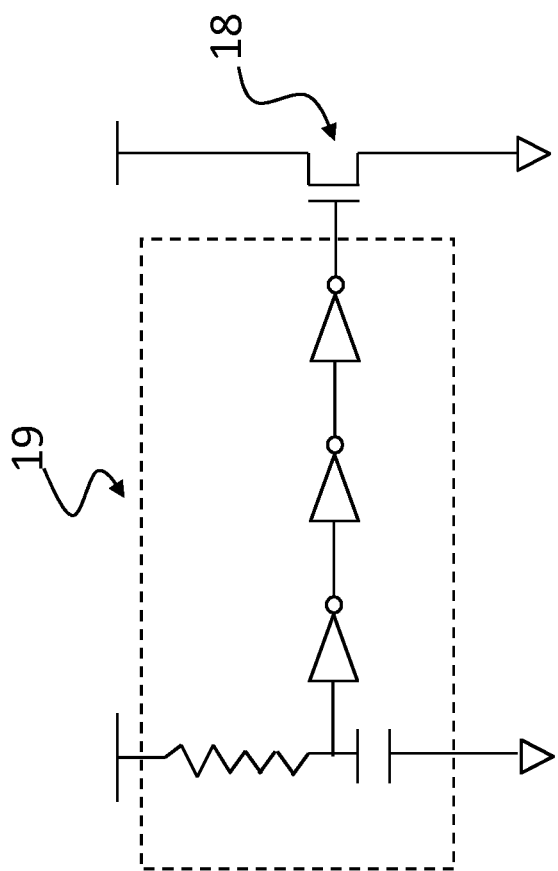
FIG. 5 is a circuit diagram of an RC circuit.

Turning now to FIG. 4, a circuit diagram of an ESD protection device 400 according to embodiments of the invention is shown. The ESD protection device 400 is similar to the ESD protection devices 200, 300 shown in FIGS. 2-3. The ESD protection device 400 includes the primary ESD protection structure 5 and the additional ESD protection structure 402. However, ESD protection device 8 is shown as an RC triggered power clamp. Although the RC portion is not shown in FIG. 4, an exemplary RC circuit is shown in FIG. 5 that drives power clamp 15. It is understood that the gate of the power clamp is driven by a resistor-capacitor (RC) circuit 19 with inverters. For example, there may be three inverters. Further, the second device 15 (FIG. 2) is shown as an nFET that is connected in parallel with the pull-down transistor network 4. The gate of the nFET is connected to the gate of the RC triggered power clamp 8 via connection 20. During an ESD event, a triggering signal (from the RC circuit (not shown)) provides the turn-on voltage to turn on the nFET in order to protect the pull-down transistor network 4.

A method to design the ESD protection device includes initially sizing the primary ESD protection structure 5 small enough to meet integrated circuit requirements, such as area and capacitance/resistance loads, and the signal specifications for the SST transmitter. Next, the first device 14 and second device 15 are chosen to effectively clamp the ESD voltage locally. In this way, the primary ESD protection structure 5 will be small enough to fit within the design window, and the additional ESD protection structure successfully aids in clamping the ESD voltage to protect the transistor networks 3, 4.

Figure 6:
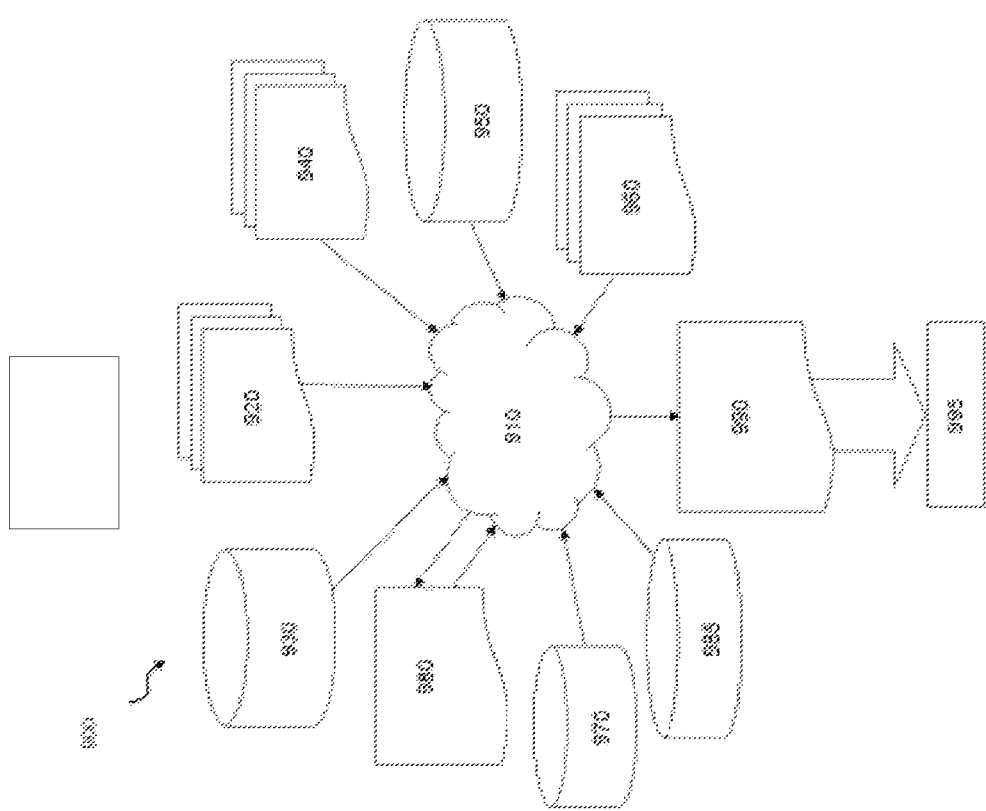
FIG. 6 is a flow diagram of a design process used in semiconductor design, manufacture, and/or test according to embodiments of the invention.

FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2-4. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-4. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-4 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-4. In one embodiment, design structure 990 may comprise a compiled, executable HDL simulation model that functionally simulates the devices shown in FIGS. 2-4.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-4. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electrostatic discharge (ESD) protection device for a high-speed source serial termination (SST) transmitter, the ESD protection device comprising:

a primary ESD protection structure at an output of the SST transmitter; and an additional ESD protection structure in parallel with a slice of the SST transmitter, the additional ESD protection structure including:

a first device in parallel with a pull-up transistor network within the slice, wherein the pull-up transistor network includes a plurality of p-type field effect transistors (pFETS), wherein the first device includes an n-type field effect transistor (nFET), and wherein a gate of the nFET is connected to ground; and a second device in parallel with a pull-down transistor network within the slice, wherein the pull-down transistor network includes a plurality of nFETS.

2. The ESD protection device of claim 1, further comprising a plurality of slices for the SST transmitter.

3. The ESD protection device of claim 2, further comprising an additional ESD protection structure in parallel with each slice of the SST transmitter.

4. The ESD protection device of claim 1, further comprising a first series terminator resistor between the output of the SST transmitter and the pull-up transistor network and a second series terminator resistor between the output of the SST transmitter and the pull-down transistor network.

5. The ESD protection device of claim 4, wherein the first device is connected to a node between the first series terminator resistor and the pull-up transistor network, and connected to a power supply.

6. The ESD protection device of claim 5, wherein the second device is connected to a node between the second series terminator resistor and the pull-down transistor network, and connected to ground.

7. The ESD protection device of claim 1, wherein the second device includes a pFET, and wherein a gate of the pFET is connected to a power supply.

8. The ESD protection device of claim 1, wherein the second device includes an nFET, and wherein a gate of the nFET is connected to a gate of an RC power clamp in the primary ESD protection structure.

9. A design structure tangibly embodied in a machine readable medium for designing, manufacturing, or testing an integrated circuit, the design structure comprising an electrostatic discharge (ESD) protection device for a high-speed source serial termination (SST) transmitter, the ESD protection device comprising:

a primary ESD protection structure at an output of the SST transmitter; and an additional ESD protection structure in parallel with a slice of the SST transmitter, the additional protection ESD structure including:

a first device in parallel with a pull-up transistor network within the slice, wherein the pull-up transistor network includes a plurality of p-type field effect transistors (pFETS), wherein the first device includes an n-type field effect transistor (nFET), and wherein a gate of the nFET is connected to ground; and a second device in parallel with a pull-down transistor network within the slice, wherein the pull-down transistor network includes a plurality in nFETS.

10. The design structure of claim 9, further comprising a plurality of slices for the SST transmitter.

11. The design structure of claim 10, further comprising an additional ESD protection structure in parallel with each slice of the SST transmitter.

12. The design structure of claim 9, further comprising a first series terminator resistor between the output of the SST transmitter and the pull-up transistor network and a second series terminator resistor between the output of the SST transmitter and the pull-down transistor network.

13. The design structure of claim 12, wherein the first device is connected to a node between the first series terminator resistor and the pull-up transistor network, and connected to a power supply.

14. The design structure of claim 13, wherein the second device is connected to a node between the second series terminator resistor and the pull-down transistor network, and connected to ground.

15. The design structure of claim 9, wherein the second device includes a pFET, and wherein a gate of the pFET is connected to a power supply.

16. The design structure of claim 9, wherein the second device includes an nFET, and wherein a gate of the nFET is connected to a gate of an RC power clamp in the primary ESD structure.

* * * * *